(12) United States Patent
Morin et al.

(10) Patent No.: US 10,516,222 B2
(45) Date of Patent: Dec. 24, 2019

(54) TOOL AND METHOD FOR HANDLING A PART

(75) Inventors: Leo Morin, Edmonton (CA); Keith I. Yeats, Edmonton (CA); Martin S. Niles, Stony Plain (CA); Casey Douglas Merrills, Carvel (CA)

(73) Assignee: Cantega Technologies Inc., Edmonton, Alberta (CA)

( * ) Notice: Subject to any disclaimer, the term of this patent is extended or adjusted under 35 U.S.C. 154(b) by 0 days.

(21) Appl. No.: 13/471,024

(22) Filed: May 14, 2012

(65) Prior Publication Data
US 2012/0284997 A1 Nov. 15, 2012

Related U.S. Application Data

(60) Provisional application No. 61/485,498, filed on May 12, 2011.

(51) Int. Cl.
H01R 11/14 (2006.01)
H02G 1/00 (2006.01)
G01R 1/22 (2006.01)

(52) U.S. Cl.
CPC .............. *H01R 11/14* (2013.01); *G01R 1/22* (2013.01); *H02G 1/00* (2013.01); *Y10T 29/49826* (2015.01); *Y10T 29/49947* (2015.01)

(58) Field of Classification Search
CPC ..... H01R 11/14; H02G 1/00; Y10T 29/49826; Y10T 29/49947
USPC ......... 29/464, 468, 559, 729, 739, 750, 760, 29/270, 281.1, 225, 229; 81/53.1, 487, 81/351; 294/174, 209; 269/43, 45
See application file for complete search history.

(56) References Cited

U.S. PATENT DOCUMENTS

| 1,245,924 | A |   | 11/1917 | Johnson |
| 1,539,302 | A | * | 5/1925  | Ellsworth ........................ 81/3.8 |
| 1,718,398 | A | * | 6/1929  | Zaeske .......................... 294/104 |
| 2,264,391 | A | * | 12/1941 | MacLeod ........................ 29/225 |

(Continued)

FOREIGN PATENT DOCUMENTS

| EP | 0183339    | 8/1985 |
| JP | 2012013594 | 1/2012 |

OTHER PUBLICATIONS

"Blanket Accessories: Clamp Pins", Salisbury by Honeywell, Feb. 2011.

(Continued)

*Primary Examiner* — David P Bryant
*Assistant Examiner* — Darrell C Ford
(74) *Attorney, Agent, or Firm* — Anthony R. Lambert

(57) ABSTRACT

A tool and method for handling a part within an electrical power transmission system is disclosed, the part having a flange with a hole through the flange. A first jaw and a second jaw are connected to pivot relative to one another and have respective ends that converge upon closure, for example to hold the flange between the respective ends. The first jaw may have a tooth extended at the respective end of the first jaw for fitting within the hole in the flange to hold the flange between the respective ends when the tool is in a closed position. The tool may be a hot stick adapter, or may include a hot stick made at least in part of dielectric material. An actuator may be connected to operate one or both of the first jaw and the second jaw from a user end of the hot stick.

13 Claims, 8 Drawing Sheets

(56) References Cited

U.S. PATENT DOCUMENTS

| | | | | |
|---|---|---|---|---|
| 2,288,776 | A * | 7/1942 | Bodendieck | H01R 11/15 |
| | | | | 81/112 |
| 2,316,428 | A | 4/1943 | Heinrich | |
| 2,514,063 | A | 7/1950 | Hubbard | |
| 2,630,730 | A | 3/1953 | Thornton | |
| 2,658,784 | A | 3/1953 | Runde | |
| 2,966,817 | A * | 1/1961 | Wengen | 81/53.1 |
| 3,057,233 | A * | 10/1962 | Turner | 72/409.12 |
| 3,473,837 | A * | 10/1969 | Goodman | 29/278 |
| 3,666,311 | A | 5/1972 | McMullin | |
| 3,670,390 | A * | 6/1972 | Brzoska | 29/271 |
| 3,788,691 | A | 1/1974 | McMullin | |
| 3,840,969 | A | 10/1974 | Landis | |
| 4,242,930 | A | 1/1981 | Myers et al. | |
| 4,483,058 | A | 11/1984 | Clutter et al. | |
| 4,653,309 | A * | 3/1987 | Hendricks et al. | 72/391.2 |
| 4,799,005 | A * | 1/1989 | Fernandes | 324/127 |
| 4,808,916 | A * | 2/1989 | Smith-Vaniz | 324/110 |
| 4,829,298 | A * | 5/1989 | Fernandes | 340/870.27 |
| 4,855,671 | A * | 8/1989 | Fernandes | 324/127 |
| 4,881,434 | A * | 11/1989 | Keller | 81/426 |
| 4,934,949 | A * | 6/1990 | Charneski et al. | 439/387 |
| 5,058,414 | A * | 10/1991 | Hayes | 72/379.2 |
| 5,153,383 | A | 10/1992 | Whited et al. | |
| 5,247,725 | A * | 9/1993 | Vaughn, Jr. | B25J 1/04 |
| | | | | 29/225 |
| 5,387,021 | A * | 2/1995 | Brewer | 294/115 |
| 5,451,730 | A * | 9/1995 | Phillips, Sr. | 200/43.11 |
| 5,485,307 | A | 1/1996 | Kim | |
| 5,666,253 | A * | 9/1997 | Whited et al. | 361/1 |
| 5,742,220 | A * | 4/1998 | Scherer | 337/171 |
| 5,773,777 | A * | 6/1998 | Scherer | 218/1 |
| 5,884,540 | A * | 3/1999 | Mo | 81/423 |
| 5,967,575 | A * | 10/1999 | Blake | B63B 21/54 |
| | | | | 114/221 R |
| 6,189,190 | B1 * | 2/2001 | Gillet et al. | 29/229 |
| 6,454,330 | B1 | 9/2002 | Chen | |
| 6,474,197 | B1 * | 11/2002 | Browen et al. | 81/3.8 |
| 6,725,745 | B1 * | 4/2004 | Palmieri | 81/53.1 |
| 7,111,526 | B1 * | 9/2006 | Flojo | 81/53.1 |
| 7,269,892 | B2 * | 9/2007 | Miyazaki | 29/739 |
| 7,666,024 | B2 * | 2/2010 | De France | 439/479 |
| 7,721,459 | B2 * | 5/2010 | Niles | 33/811 |
| 7,740,296 | B2 * | 6/2010 | DaVia | 294/104 |
| 7,834,269 | B2 | 11/2010 | Niles | |
| 7,859,378 | B2 * | 12/2010 | Merck et al. | 336/90 |
| 8,069,754 | B2 * | 12/2011 | Elgin | B25B 13/06 |
| | | | | 81/112 |
| 8,342,494 | B2 * | 1/2013 | Ricci et al. | 269/86 |
| 8,398,134 | B1 * | 3/2013 | Mortensen | 294/191 |
| 8,708,385 | B2 * | 4/2014 | Dion et al. | 294/209 |
| 2004/0149474 | A1 * | 8/2004 | Brittain | H02G 7/14 |
| | | | | 174/42 |
| 2005/0199100 | A1 * | 9/2005 | Weaver et al. | 81/53.1 |
| 2006/0176623 | A1 * | 8/2006 | Stillwagon et al. | 361/1 |
| 2007/0017301 | A1 * | 1/2007 | Prsha et al. | 73/860 |
| 2008/0123254 | A1 * | 5/2008 | Niles | 361/602 |
| 2009/0014208 | A1 * | 1/2009 | Quesnel | 174/40 CC |
| 2010/0139459 | A1 * | 6/2010 | Jackson | B25B 13/5091 |
| | | | | 81/177.2 |
| 2011/0094342 | A1 * | 4/2011 | Creech et al. | 81/3.8 |
| 2011/0101716 | A1 * | 5/2011 | Nolte et al. | 294/19.1 |
| 2012/0150197 | A1 * | 6/2012 | Malkowski | 606/144 |
| 2012/0151742 | A1 | 6/2012 | Morin et al. | |
| 2012/0284997 | A1 | 11/2012 | Morin et al. | |
| 2013/0152388 | A1 * | 6/2013 | Graham | 29/887 |
| 2014/0373688 | A1 * | 12/2014 | Scarpuzzi | 81/318 |
| 2016/0203741 | A1 * | 7/2016 | White | A47F 13/06 |
| | | | | 248/544 |

OTHER PUBLICATIONS

"Salisbury Electrical Protection p. 20", Western Safety Products, Feb. 2011.
"Hubbell Power Systems p. 6", Western Safety Products, Feb. 2011.
"Hubbell Power Systems p. 12", Western Safety Products, Feb. 2011.
"High Voltage Electrical Conductor Cover", Yotsugi Co., Ltd. [online], http://www.yotsugi.co.jp/english/m2/m2m2.html, accessed Feb. 23, 2011.
"American Hotline Universal Tool, All-Angle Pliers", J.L. Matthews Co. Inc. [online], http://shopjlmatthews.com/store/product1070.html, accessed Feb. 23, 2011.
"Safetyshield Hot Stick Barrier for Ratchet Wire Cutters", Hubbell Power Systems [online], http://www.hubbellpowersystems.com/lineman/insulated/safetyshield/ratchet.asp, accessed Feb. 11, 2011.
"Spiral Conductor Covers", Hubbell Power Systems [online], http://www.hubbellpowersystems.com, accessed Feb. 23, 2011.
"Hot Sticks & Tools", Salisbury by Honeywell, 2003, Bolingbrook, IL.
"Shotgun Sticks", J.L. Matthews Co., Inc. [online], http://shopjlmatthews.com/store/Hot-Shotgun-ss6.html, accessed Jun. 17, 2013.

* cited by examiner

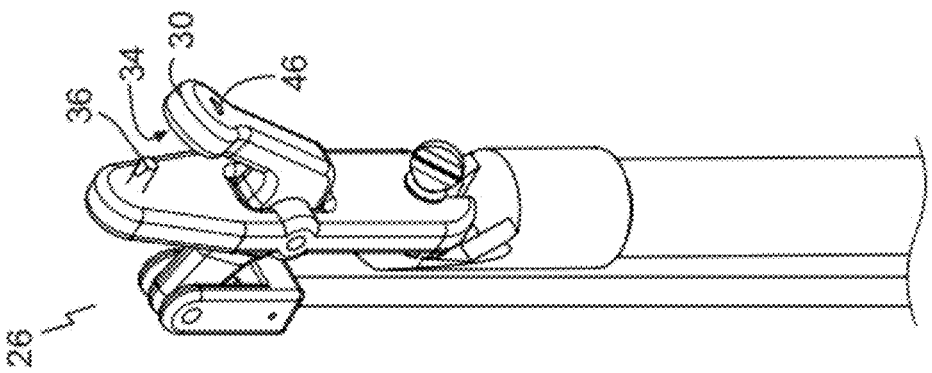
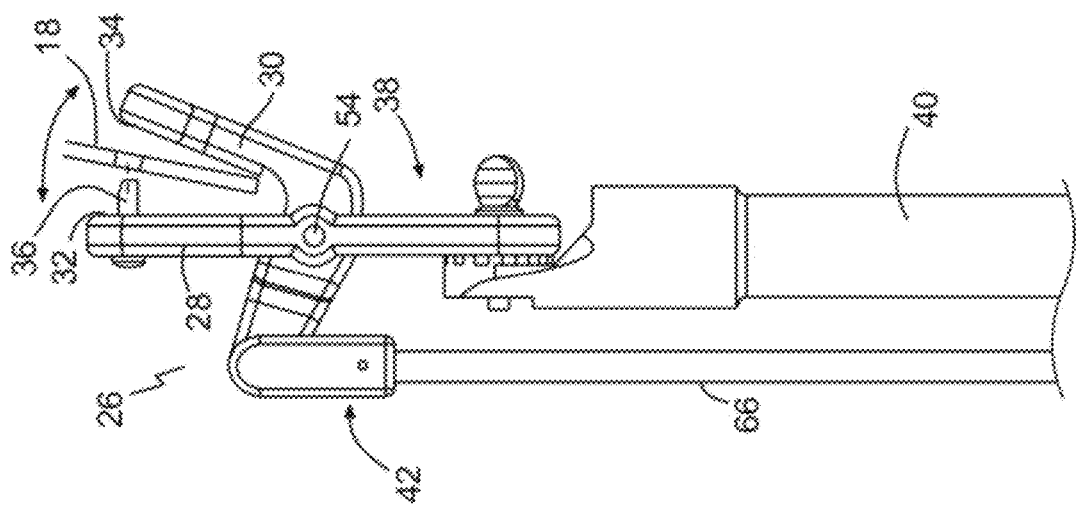
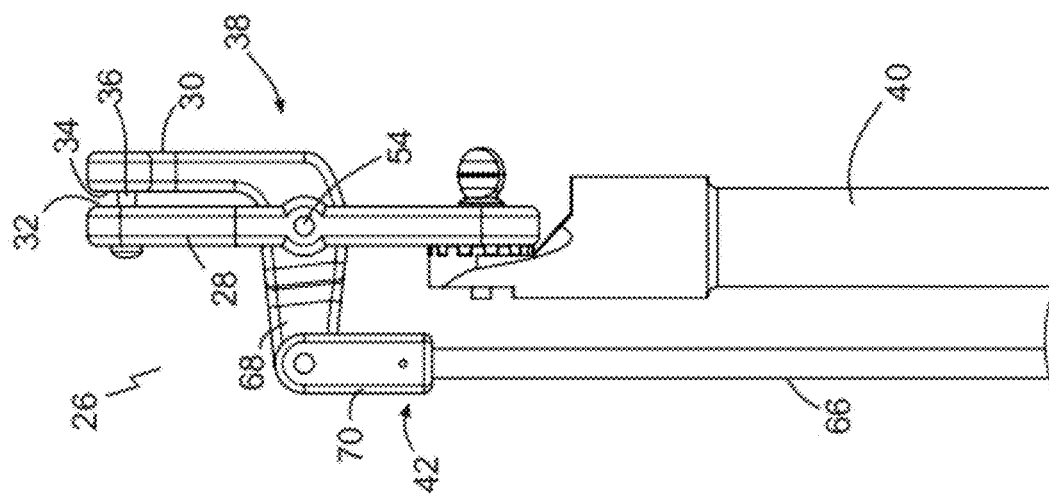

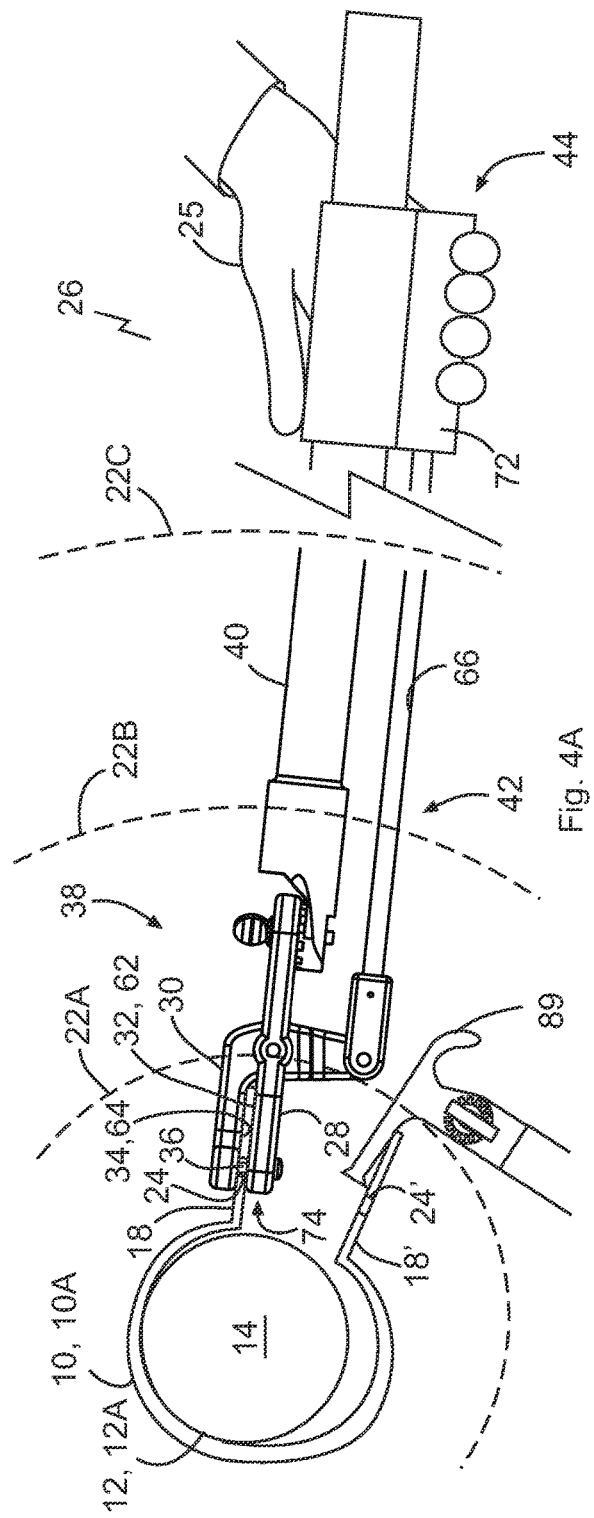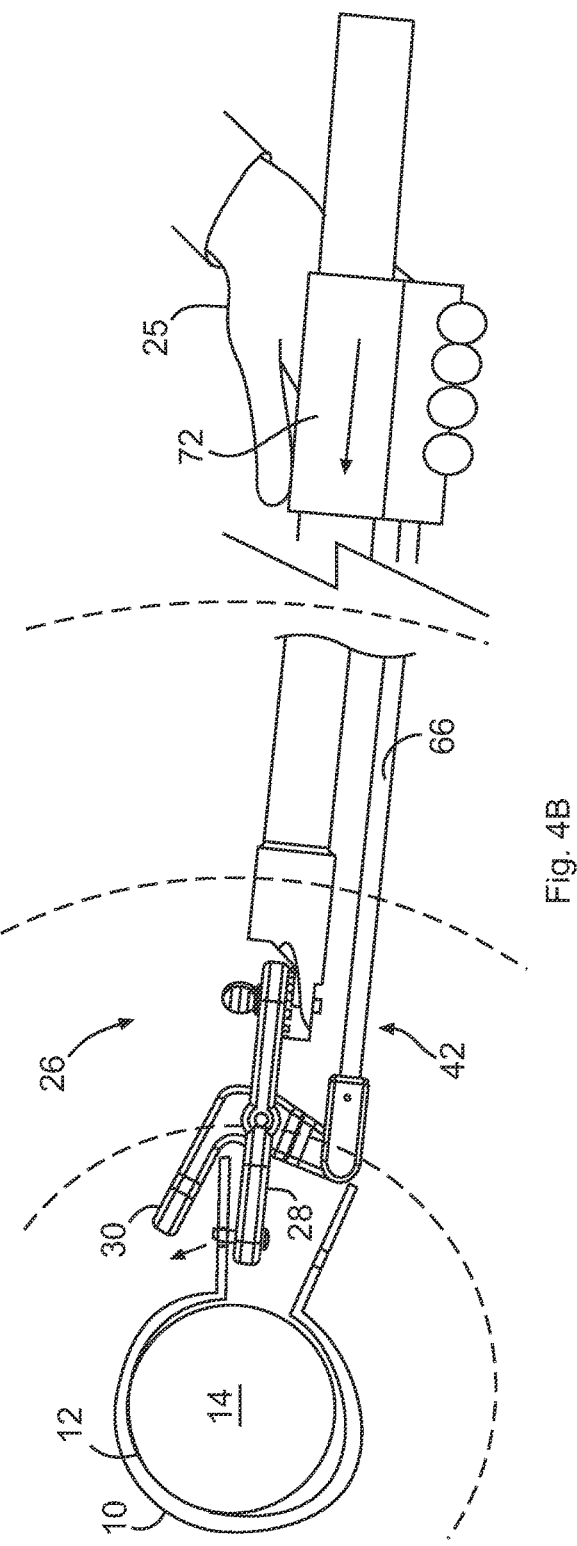

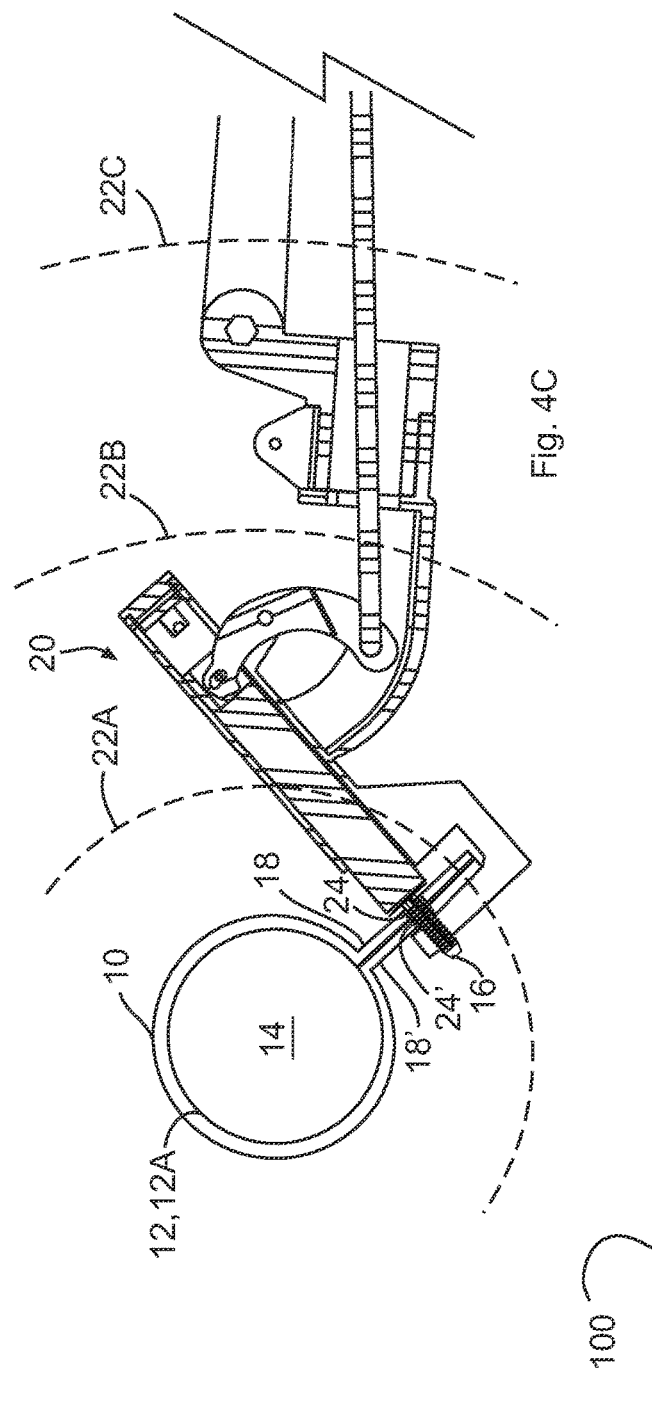

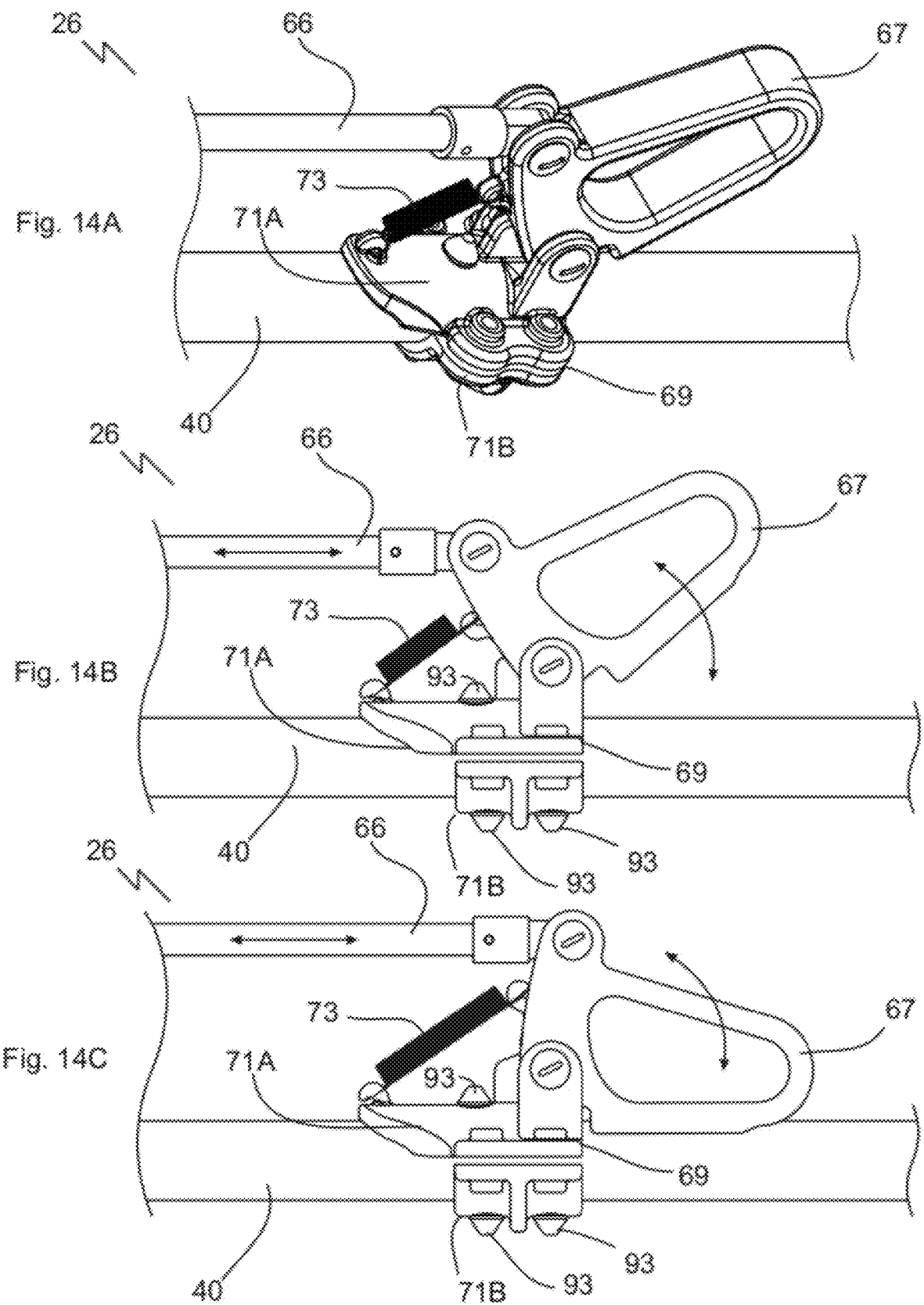

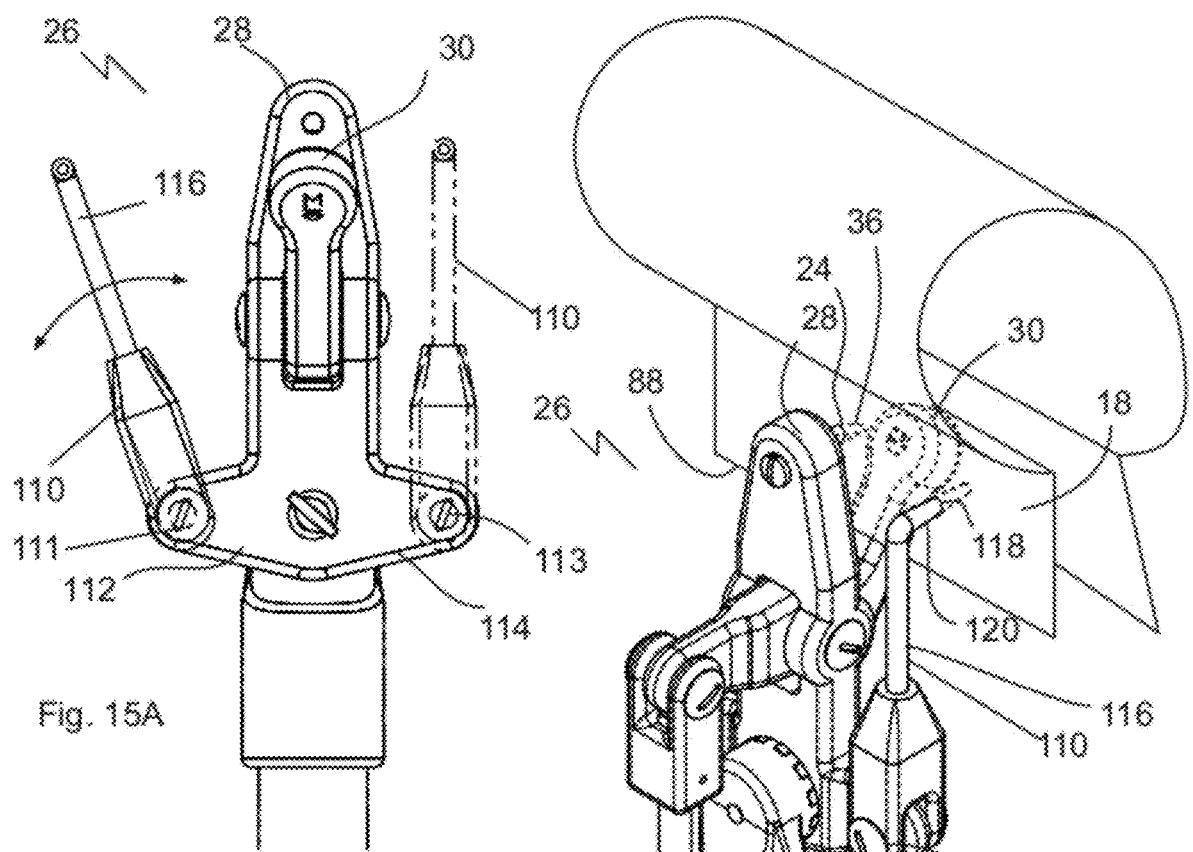
Fig. 15A
Fig. 15B
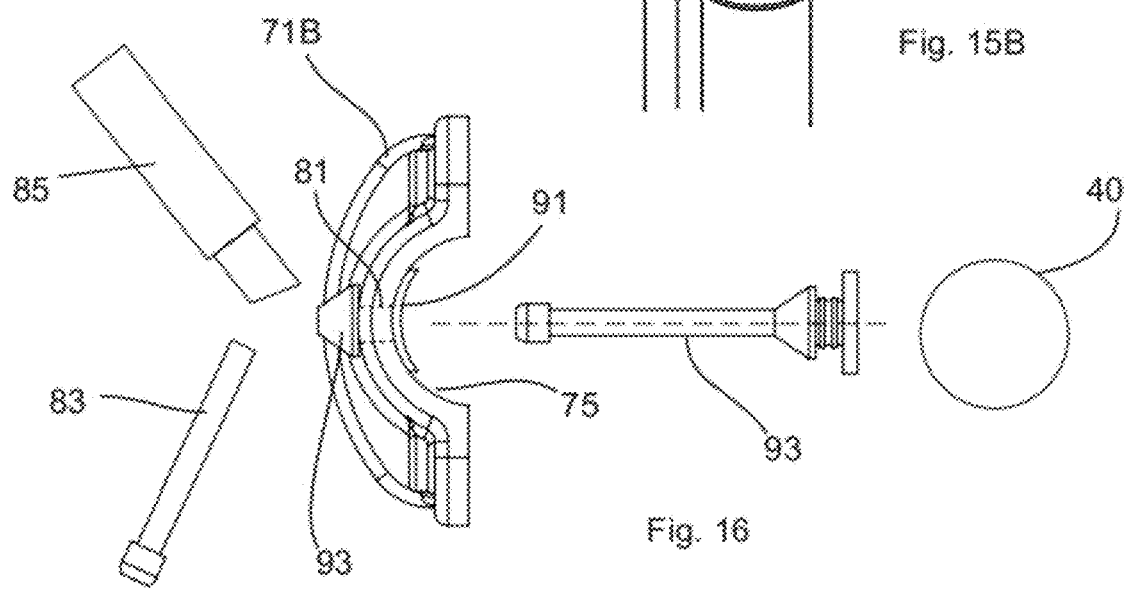
Fig. 16

TOOL AND METHOD FOR HANDLING A PART

CROSS-REFERENCE TO RELATED APPLICATIONS

This application claims the benefit under 35 USC 119(e) of U.S. provisional application Ser. No. 61/485,498 filed May 12, 2011.

TECHNICAL FIELD

This document relates to tools and methods for handling parts.

BACKGROUND

Various tools may be used to allow a part to be positioned or manipulated indirectly. In the electrical power transmission industry, a hot stick may be used to manipulate a part. Example hot stick adapters that allow such manipulation are all-angle pliers adapters or clamp adapters.

Dielectric protectors, such as covers, may be used to insulate components of electrical power systems from animals and birds. Examples of such protectors are disclosed in US patent publication no. 2008-0123254. Some of these protectors are secured in place using simple push fasteners that fit through preexisting holes to secure the pieces of the protector to one another. The holes may be bored through corresponding flanges that extend from the protector.

SUMMARY

A tool for handling a part within an electrical power transmission system is disclosed, the part having a flange with a hole through the flange, the tool comprising: a first jaw and a second jaw connected to pivot relative to one another and having respective ends that converge upon closure to hold the flange between the respective ends; the first jaw having a tooth extended at the respective end of the first jaw for fitting within the hole in the flange to hold the flange between the respective ends when the tool is in a closed position; a hot stick made at least in part of dielectric material; and an actuator connected to operate one or both of the first jaw and the second jaw from a user end of the hot stick.

A method of handling a part having a flange with a hole through the flange is disclosed, the method comprising: pivotally converging respective ends of a first jaw and a second jaw relative to one another to insert a tooth, extended at the respective end of the first jaw, within the hole in the flange to hold the flange between the respective ends; positioning the part within an electrical power transmission system using a hot stick connected to operate the first jaw and the second jaw; and opening the first jaw and the second jaw relative to one another with an actuator to release the part.

A tool for handling a part within an electrical power transmission system, the part having a flange with a hole through the flange is disclosed, the tool comprising: a first jaw and a second jaw connected to pivot relative to one another and having respective ends that converge upon closure to hold the flange between the respective ends; the first jaw having a tooth extended at the respective end of the first jaw for fitting within the hole in the flange to hold the flange between the respective ends when the tool is in a closed position; and in which the first jaw and the second jaw form at least part of an adapter for a hot stick.

A tool for handling a part within an electrical power transmission system is disclosed, the part having a flange, the tool comprising: a first jaw and a second jaw connected to pivot relative to one another and having respective ends that converge upon closure to grip and stabilize the flange between respective surfaces defined by the respective ends in a closed position; a hot stick made at least in part of dielectric material; and an actuator connected to operate one or both of the first jaw and the second jaw from a user end of the hot stick.

These and other aspects of the device and method are set out in the claims, which are incorporated here by reference.

BRIEF DESCRIPTION OF THE FIGURES

Embodiments will now be described with reference to the figures, in which like reference characters denote like elements, by way of example, and in which:

FIG. 1 is a side elevation view of a tool for handling a part, with both jaws in a closed position.

FIG. 2 is a side elevation view of the tool of FIG. 1 with the jaws in an open position.

FIG. 3 is a perspective view of the tool of FIG. 1 in an open position.

FIG. 4A is a side elevation view, partially in section, of the tool of FIG. 1 being used to position a dielectric protector over a component of an electrical power transmission system.

FIG. 4B is a side elevation view, partially in section, of the tool of FIG. 1 releasing the dielectric protector cover.

FIG. 4C is a side elevation view, partially in section, of a fastener tool being used to apply a fastener through aligned holes in corresponding flanges of the protector.

FIG. 5 is a flow diagram of a method of handling a part having a flange with a hole through the flange.

FIG. 14A is a perspective view of a trigger lever mounted on a hot stick for operating the tool actuator.

FIGS. 14B-C are side elevation views that illustrate the operation of the trigger lever of FIG. 14A.

FIG. 15A is a side elevation view of an embodiment of a tool with a flange positioner arm and dashed lines used to indicate an alternate position of the flange positioner arm on the tool.

FIG. 15B is a perspective view of the tool of FIG. 15A with a flange fitted on the tooth and the flange positioner arm.

FIG. 16 is an exploded top plan view of a method of mounting a trigger bracket to the hot stick.

DETAILED DESCRIPTION

Figure 7:
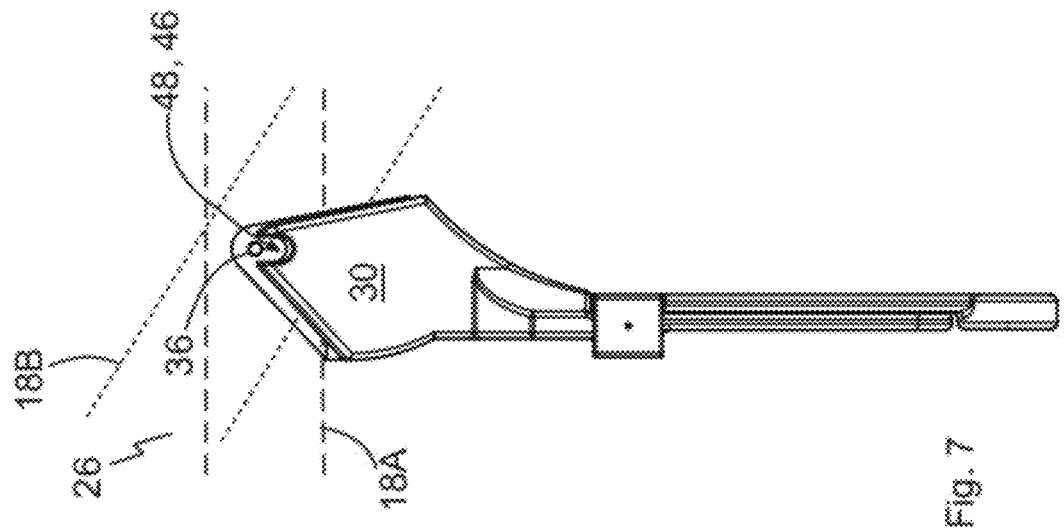
FIG. 7 is a top plan view of another embodiment of a tool for handling a part.

Immaterial modifications may be made to the embodiments described here without departing from what is covered by the claims.

Long-distance electricity transmission is typically carried with high voltage conductors. Transmission at higher voltages reduces resistance power loss, therefore line voltage for long distance lines is stepped up after generation by passing it through transformer stations prior to feeding the power to long-distance transmission lines. Transmission lines traverse large regions and require numerous support towers. The conductors in high tension powerlines are typically uninsulated because of the cost and additional weight of insulated versus uninsulated conductors. Because clearances between adjacent energized elements, and energized and grounded elements, are generally large in transmission systems, these systems generally are not at risk for animal-caused faults or outages.

Substations transform power from transmission voltages to distribution voltages, typically ranging from 2400 volts to 37,500 volts. Distribution voltages allow for reduced system clearances. These reduced clearances between phase to ground and phase to phase increase station susceptibility to bird or animal caused outages. Electric poles, towers, and other electrical equipment including substations may provide attractive roosts for birds, particularly in treeless regions. If the wings of a bird simultaneously contact a conductor and another object such as an adjacent conductor, support tower or tree, the resulting electrical short-circuit can kill the bird and also damage the power system. The electrical short circuit can further cause electrical system damage resulting in power outages.

Further, the nesting of birds in open cavities in electrical systems increases the risk that predators will be attracted to the nests and cause a power fault or outage. Predators can be mammals such as raccoons and cats, birds such as magpies, and snakes. Predators can also cause electrical short-circuits that can cause electrical faults or outages, damage power systems, and kill the predator. Faults caused by birds and other animals often trigger sensitive relay protection schemes, resulting in substation lockouts, interrupting service to thousands or possibly tens of thousands of customers and at the same time damaging expensive substation equipment.

Thus, in the field of electrical power transmission and distribution there is a benefit to be gained by insulating electrical power systems from short circuits caused by contact by birds and other animals. The variety and number of proposed solutions for repelling birds and other animals from electrocution risks highlights the persistence and magnitude of the problems created by such undesirable intrusion. Many different types of scarecrows and other moving devices have been developed to repel birds. In addition to moving devices, various physical structures often involving spikes or other physical barriers, have been developed to discourage birds from roosting on structures. Other bird repelling concepts use electricity or magnetic fields to discourage bird intrusion. Equipment shield and cage devices have been specifically designed to block birds and other animals from accessing and short-circuiting electrical leads, such as described in U.S. Pat. Nos. 5,153,383 and 5,485,307.

The inventor's own prior patent document discloses dielectric protectors for protecting components of electrical power transmission systems, see United States patent publication no. 20080123254, as well as methods of making such protectors. Other dielectric protectors or protectors are available.

Generally, the process of retrofitting electrical equipment with dielectric protectors may be costly and may require powering down the system. Power downs for the purpose of measuring electrical equipment for protective protectors can keep a system down for a half a day or longer time periods, at great cost. Some systems are operated under the direction of a regulatory and scheduling authority that controls the system's downtime scheduling. In locations with minimal spare power transmission capacity, it can be a challenge for a system to get the downtime needed to measure its equipment. Because electrical systems are usually scheduled for maintenance downtime on a fairly short notice (typically a week for non-emergency situations), and because scheduled downtime may be cancelled by the Regulatory Authority on an extremely short notice, there is no guarantee that a component protector will be installed during a system's available downtime period. As a result, a system can experience significant delays in protecting their equipment.

Referring to FIGS. 4A-4C, there exists a variety of dielectric protectors 10 used to insulate components 12 of electrical power systems 14 from animals and birds. FIG. 4A illustrates a cross-section of an example protector 10, which is a bushing protector 10A sold by Cantega Technologies Inc. of Edmonton, Canada. The exemplary component 12 shown is thus a bushing 12A but for simplicity bushing 12A is not shown in detail. These protectors 10 may be installed by hand on components 12 located on equipment that has been de-energized, or remotely installed using a hot stick tool, such as tool 26. For hand installation, the workers installing the protector 12 may be wearing personal protective equipment such as Kevlar gloves, which can make it awkward to handle the protector 10. Such challenges make protector 10 installations slow and increase the amount of costly equipment downtime needed to secure the protectors in place. In addition, it is not always feasible to de-energize electrical equipment in order to install protective protectors 10 and as a result, it is desirable to be able to install and secure protectors remotely on energized equipment. Remote installation may also be desirable on energized or non-energized equipment that is difficult to access directly. Therefore, there is a need for a tool such as tool 26 that can be used in combination with a dielectric hot stick 40 by a user 25 (FIG. 4A) located outside the safe limit of approach 22C for energized equipment in order to remotely position protectors 10 in place.

Some of these protectors 10 may be secured in place using fasteners such as push fasteners 16 (FIG. 4C) that fit through aligned holes 24 and 24' in cooperating flanges 18 and 18', respectively, of the protector 10. Other securing fasteners may be used, such as tie wraps or staples. Like protectors 10, push fasteners 16 may be hand-installed on protectors 10 located on equipment that has been de-energized, or remotely installed using a fastener applicator 20 as shown in FIG. 4C. Again, however, hand-installation may be difficult for the reasons stated above with regards to protector 10 installation, and a fastening method that requires a power down may defeat the purpose of using a tool 26 (FIG. 4A) that allows the protector 10 to be positioned without a power down. Thus, in some embodiments the tool 26 may be used in combination with a fastening device such as fastener applicator 20 that allows remote fastening to be carried out by a user (not shown in FIG. 4C) located outside the safe limit of approach 22C for energized equipment in order to complete installation of the dielectric protector 10.

Referring to FIGS. 1-3, 4A and 6, a tool 26 is disclosed for handling a part, such as a dielectric protector 10 (FIG. 4A) for a component 12 of an electrical power transmission system 14. As described above, dielectric protector 10 may have a flange 18, which may have a hole 24 through the flange 18 (FIG. 4A). FIGS. 1-2 and 4A illustrate that tool 26 has a first jaw 28 and a second jaw 30 connected to pivot relative to one another and having respective ends 32 and 34 that converge upon closure, for example to hold the flange 18 (FIG. 4A) between the respective ends 32 and 34. The first jaw 28 may have a tooth 36 extended at the respective end 32 of the first jaw 28 for fitting within the hole 24 in the flange 18 to hold the flange 18 between the respective ends 32, 34, when the tool 26 is in a closed position (FIG. 4A). Tool 26 may comprise a hot stick 40 made at least in part of dielectric material. In general, other portions of the tool 26 may be made at least partially of dielectric material as well. In embodiments such as the one shown, jaws 28, 30 form at least part of an adapter 38 for hot stick 40. An actuator 42 may be connected to operate one or both of the first jaw 28 and the second jaw 30 from a user end 44 (FIG. 4A) of the hot stick 40.

Figure 6:
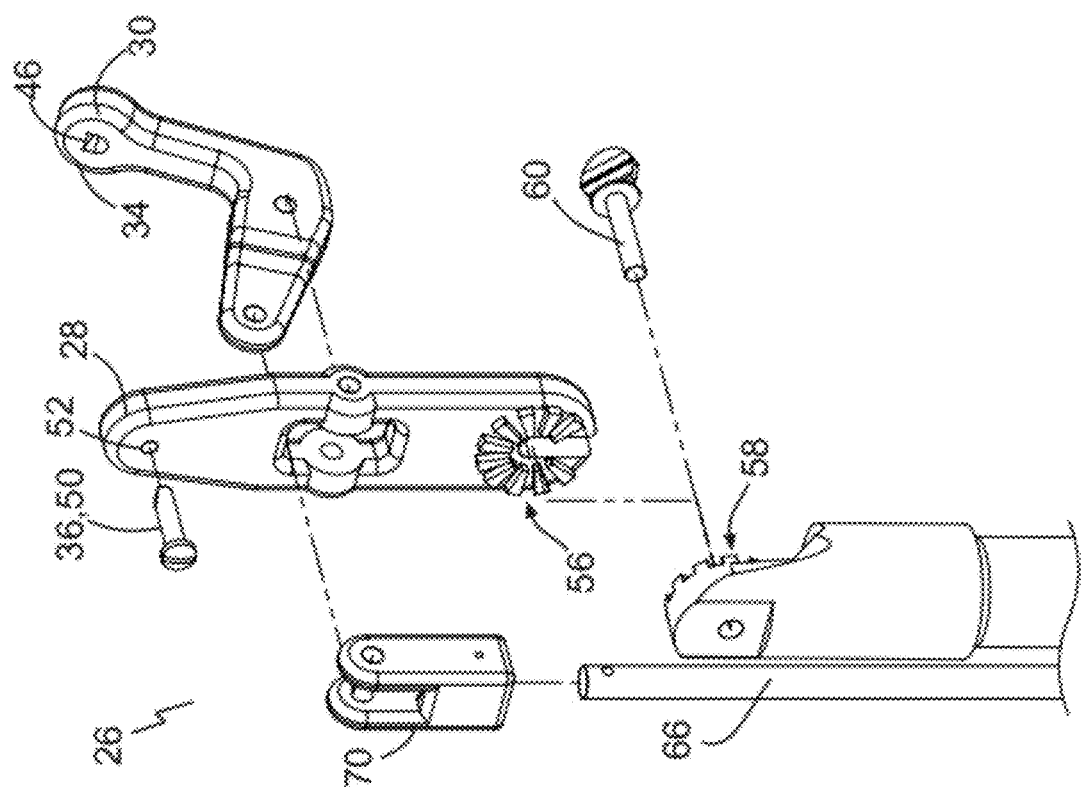
FIG. 6 is a perspective exploded view of the tool of FIG. 1.

FIGS. 3 and 6 illustrate that the respective end 34 of the second jaw 30 may define a slot 46 for the tooth 36 to fit within when the tool 26 is in the closed position (FIG. 1). Slot 46 may be a hole passing fully or partially through second jaw 30. Slot 46 may have other suitable shapes such as a lateral cutout or indent 48 (FIG. 7) in second jaw 30. FIG. 4A illustrates that jaw 30 may be designed to allow tooth 36 to bite jaw 30 in order to lock flange 18 in between respective ends 32 and 34. Referring to FIG. 3, the tooth 36 may be tapered or sharpened to facilitate entry into hole 24 (FIG. 4A) of flange 18. In some cases, tooth 36 may be designed to pierce a flange 18 to form the hole 24. Referring to FIG. 6, tooth 36 may be removable, for example if tooth 36 is in the form of a screw or bolt 50, as shown, that may be installed through a hole 52 in first jaw 28. Providing a removable tooth 36 allows teeth 36 of different widths and dimensions, corresponding to different flange 18 widths and hole 24 sizes, to be used with the same tool 26. In some embodiments the position of tooth 36 along respective end 32 on first jaw 28 is adjustable (not shown), for example so that tooth 36 may be moved to a different location on first jaw 28 to accommodate various sizes and shapes of flanges 18.

Referring to FIGS. 1, 2, 4A and 6, the jaws 28 and 30 may be connected in a suitable fashion. For example, second jaw 30 may be directly pivotally connected to first jaw 28 at a pivot axis 54 (FIGS. 1 and 2). In other examples jaws 28 and 30 may be pivotally connected indirectly by having each jaws 28 and 30 connected to a structural frame (not shown) and allowing one or both of jaws 28 and 30 to pivot relative the structural frame. As shown in FIGS. 1 and 2, although the jaws 28 and 30 pivot relative to one another in use, in some embodiments only one jaw, in this case jaw 30, may pivot relative to hot stick 40, since the other jaw, namely jaw 28, may be rigidly connected to hot stick 40 as shown. Where jaws 28 and 30 form part of a hot stick adaptor 38, adaptor 38 may be provided with a hot stick connector such as a universal spline attachment 56 (FIG. 6), which may connect to hot stick 40 via a corresponding universal spline attachment 58 and a locking bolt 60.

Referring to FIG. 4A, the respective ends 32 and 34 may define respective surfaces 62, 64 for gripping and stabilizing the flange 18 when the tool 26 is in the closed position. Surfaces 62 and 64 may be dimensioned to contact flange 18 over a surface area sufficient to allow protector 10 to be frictionally held in place between jaws 28 and 30. Thus, protector 10 is able to be more precisely positioned than if flange 18 is held loosely between jaws 28 and 30. For this purpose, surfaces 62 and 64 may have the appearance of paddles as shown. When surfaces 62 and 64 are used in combination with tooth 36, tool 26 is able to positively control the position of cover 10 in space without fear of dropping or shifting the position of protector 10 on accidental contact with a component 12 of the electrical power transmission system 14. In addition, because the flange 18 is integral to the part, it is not possible to accidentally knock the part out of the grip of jaws 28 and 30.

Referring to FIGS. 1, 2, 4A and 4B, the actuator 42 may comprise a drive rod 66 pivotally connected to one or both jaws, in this case connected to second jaw 30. The drive rod 66 may be operable from the user end 44 of the hot stick 40, which may be a tie stick as shown (FIG. 4A). Actuator 42 may be connected to second jaw 30 via one or more lever arms, such as arm 68, which may be integrally connected to second jaw 30 as shown (FIG. 1). One or more transition piece 70 may pivotally connect arm 68 to drive rod 66. At the user end 44 of hot stick 40, drive rod 66 may terminate in a trigger such as a slide element 72 (FIGS. 4A-B). Other suitable triggers may be used, such as a lever 67 (FIG. 14A) or squeeze trigger (not shown). A lock (not shown) may be used on the trigger to maintain the jaws 28 and 30 in the closed position to allow the user 25 to position the protector 10 without worrying about keeping constant closing pressure on the trigger. Other actuators 42 may be used, for example the actuator 42 may operate by pulley, cable, chain and sprocket, gears, solenoid, and other linkages of any kind whether mechanical or electrical or electromechanical. A non-human-powered drive source may be used to operate the actuator 42. In the embodiment illustrated, a pulling motion relative to the hot stick 40 is required to close the jaws 28 and 30, however actuator 42 may be adapted to accomplish the same movement with a pushing motion. Other forms of movement may be incorporated. Because the drive rod 66 effectively forms part of the connection between the tool 26 and user 25, the drive rod 66 may be made at least in part and preferably fully of a dielectric material to reduce chance of electrical transfer to user 25.

Referring to FIGS. 14A-C, as described above the trigger may comprise a lever 67. The lever 67 may be mounted on hot stick 40, for example by pivotal connection to a trigger collar 69 attached to hot stick 40. FIGS. 14B-C illustrate a range of pivoting motion for lever 67. The trigger collar 69 may be comprised of two or more brackets 71A and 71B at least partially surrounding hot stick 40 and bolted or otherwise connected together. Lever 67 may be biased, for example using a spring 73. In the example shown, the lever 67 is biased open, so that a user (not shown) must retain constant pressure against the biasing force in order to retain tool 26 in the closed position while positioning flange 18. On release of the lever 67, the tool 26 opens. In some embodiments, the lever 67 may be biased closed.

FIG. 16 illustrates an example bracket 71B, from FIGS. 14A-C, for attachment to a tie stick hot stick 40 shown in cross-section. Because bracket 71B and bracket 71A (FIGS. 14A-C) may be retrofitted to hot stick 40, an interior surface 75 of one or both brackets 71A and B may comprise a gripping surface 91. Gripping surface 91 may be provided by a MIDSUN™ pull through fastener 93 passed through a hole 81 in bracket 71B to lock in place as shown. The fastener 93, which may be made of a resilient material such as rubber, may then be trimmed, for example using a knife 85, to remove excess length 83 of fastener 93. In the example shown in FIGS. 14A-C, both brackets 71A and B trip hot stick 40 using fasteners 93.

In cases where a hot stick 40 is present, the actuator 42 may be operatively connected to user end 44 of the hot stick 40 as described. User end 44 is understood to be in opposed relation to the part end 74 (FIG. 4A) of the tool 26. Reference to various elements in relation to ends 44/74 in this document refer to a general positioning and should not be restricted to only a limited interpretation such as absolute extremity. Referring to FIG. 4A, for example slide element 72 is illustrated as being spaced from, but not literally at, user end 44. In some embodiments, the trigger may be closer to user end 44 than part end 74.

Figure 9:
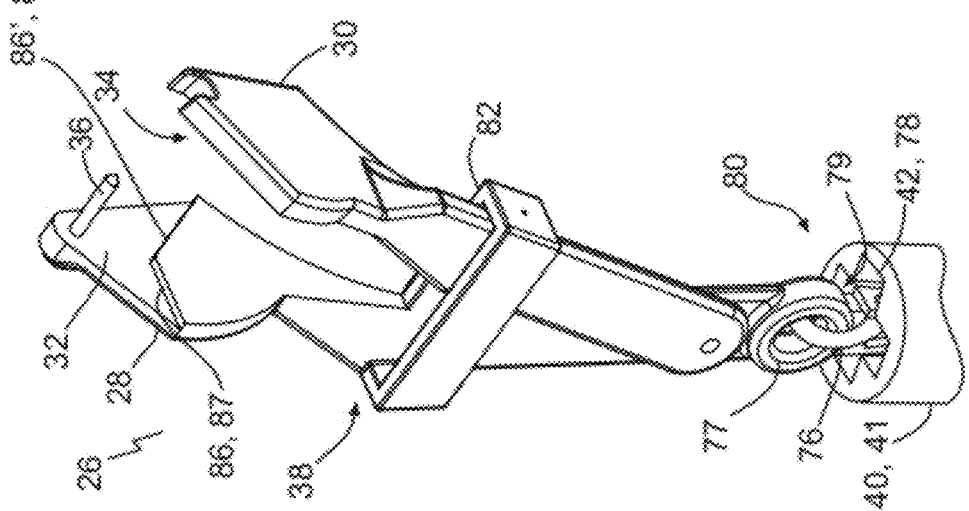
FIGS. 8 and 9 are perspective views of the tool of FIG. 7 in a closed position and an open position, respectively.
Figure 8:
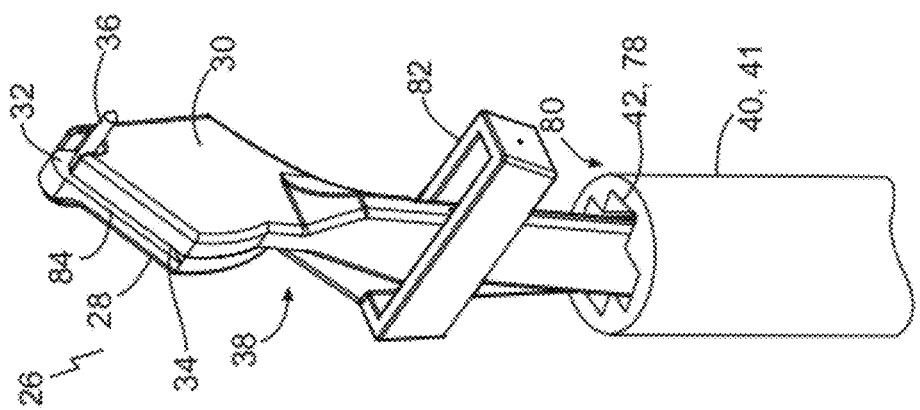

Referring to FIGS. 7-11, another embodiment of a tool 26 is illustrated, having, inter alia, jaws 28 and 30 and tooth 36, and designed to couple as an adapter 38 for a conventional universal grip-all hot stick 41 (FIGS. 8-9), for example of the type made by Salisbury of Skokie, Ill. The hot stick 40 may be connected for limited relative axial movement to one or both jaws, in this case jaw 28. This hot stick 40 may connect in such a fashion to jaw 28 using a retractable gripping hook 76 (FIG. 9), as is common in conventional universal grip-all hot sticks 41, that connects to a corresponding eyelet 77 at a hot stick end 79 of jaw 28. The actuator 42 comprises a socket 78 in a tool end 80 of the hot stick 40, the socket 78 being shaped to hold the jaws 28 and 30 in the closed position when the jaws 28 and 30 are axially retracted at least partially within the socket 78 (FIG. 8). Thus, during positioning, jaws 28 and 30 are retracted as shown in FIG. 8, and for release of the protector 10 (not shown) the jaws 28 and 30 are extended out of tool end 80 as shown in FIG. 9 to allow jaws 28 and 30 to open. To facilitate release of protector 10, the jaws 28 and 30 may be biased, for example using a spring or other suitable biasing element, into an open position. A retainer frame 82 may be used to restrict the second jaw 30 from over opening.

Figure 10:
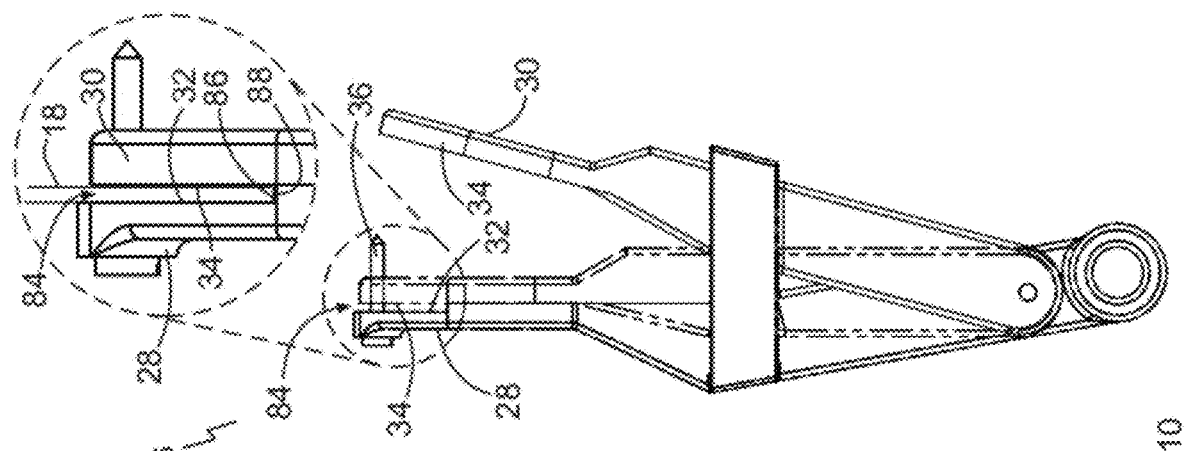
FIG. 10 is a side elevation view of the tool of FIG. 7 in an open position but with a closed position illustrated in dotted lines, and with a close-up view of the tool gripping a flange.

Referring to FIGS. 8-10, the respective ends 32, 34 may define a flange slot 84 when in the closed position (FIGS. 8 and 10). The flange slot 84 may have one or more side walls 86 and 86' (FIGS. 9 and 10) separating the respective ends 32, 34 for shouldering an edge, such as terminal edge 88, of the flange 18 in use (FIG. 10). The side walls 86 and 86' may abut edge 88 in use to restrict rotation of flange 18, and hence protector 10, about the tooth 36 when jaws 28 and 30 are closed. Thus, side wall 86 or 86' allows more precise control of the positioning of protector 10. FIG. 9 illustrates that more than one side walls may be used, in this case side walls 86 and 86'. Portions 87 and 87' of the one or more side walls 86 and 86', respectively, may be angled in convex relation to one another as shown. Referring to FIG. 7, thus a user may select a desired radial position about tooth 36 over a wider range of radial positions, for example illustrated by the positioning of flanges 18A and 18B, than if only a flat side wall 86 (shown in FIG. 9) is used. This is advantageous in that it gives a user greater flexibility in positioning the protector 10 relative to the tool 26 to allow user 25 to install protector 10 from a greater number of locations about component 12. Side walls 86 and 86' may be curved in some cases.

Figure 13:
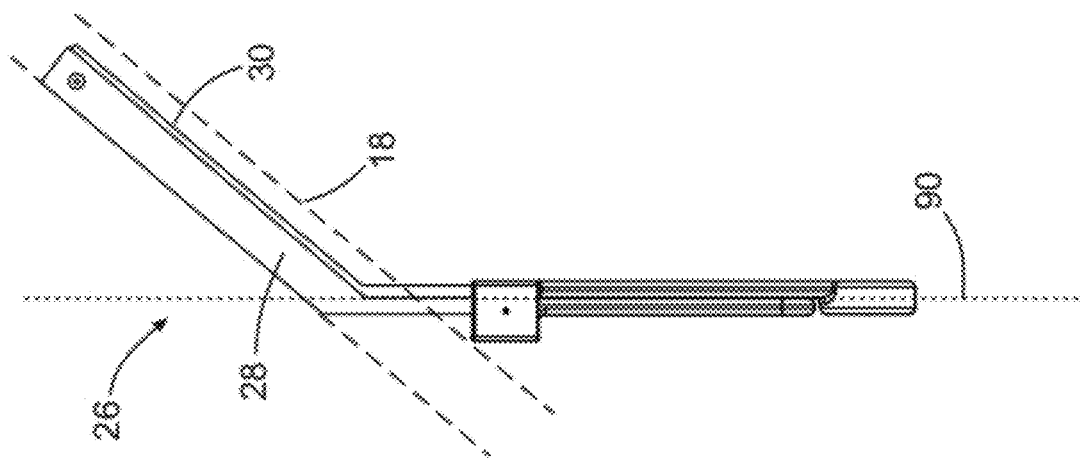
FIG. 13 is a top plan view of another embodiment of a tool for handling a part.
Figure 12:
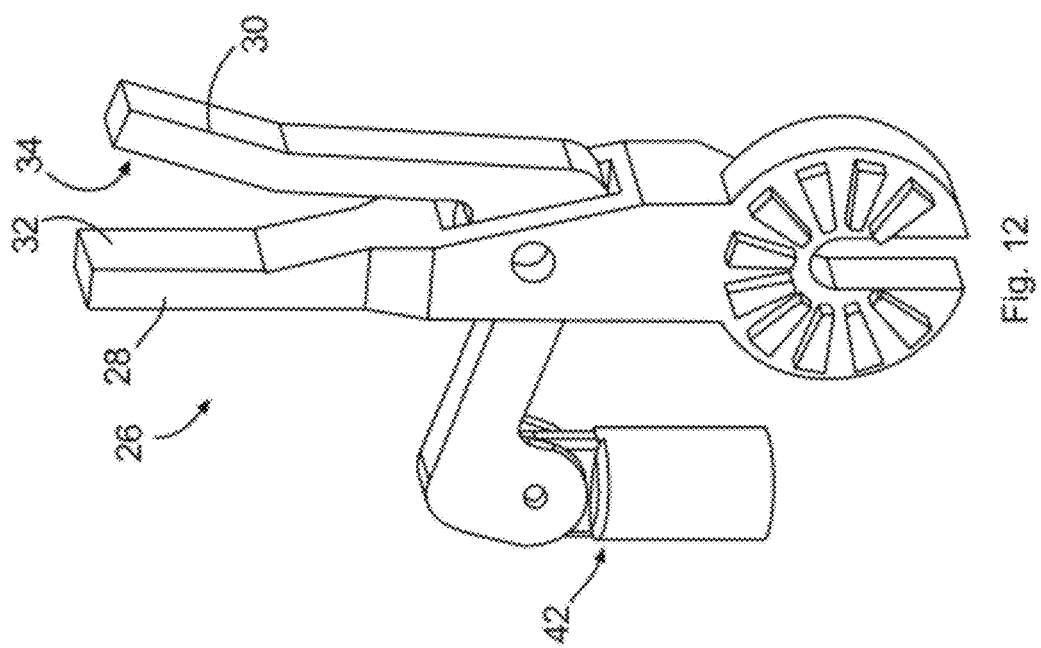
FIG. 12 is a perspective view of another embodiment of a tool for handling a part.
Figure 11:
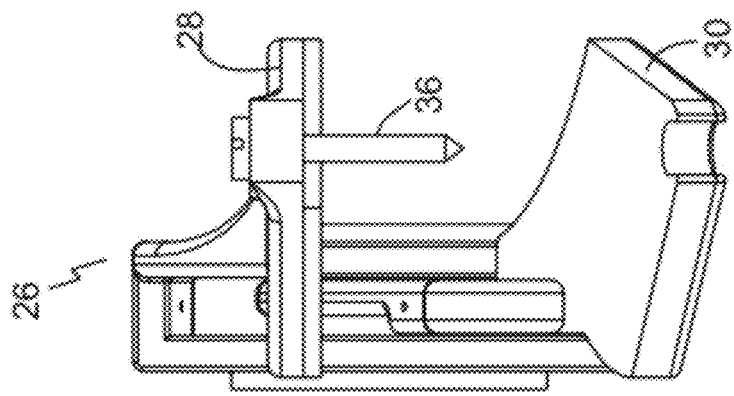
FIG. 11 is a front elevation view of the tool of FIG. 7 in an open position.

Referring to FIGS. 12 and 13, two additional embodiments of tool 26 are illustrated. Referring to FIG. 12, an embodiment of tool 26 is illustrated with an actuator 42 similar to the actuator 42 of FIG. 1, but with no tooth 36. Flange 18 (not shown) is frictionally held in place between respective surfaces 62, 64 of respective ends 32, 34, which are adapted for gripping and stabilizing the flange 18 when the tool 26 is in the closed position. Referring to FIG. 13, an embodiment of tool 26 is illustrated with jaws 28 and 30 angled relative to a hot stick axis 90 of tool 26. This embodiment allows a flange 18 to be installed at an angle relative to hot stick axis 90, which may be advantageous in positioning a protector 10. It should be understood that many other embodiments are within the scope of the disclosure herein. For example, the embodiment of FIGS. 8 and 9 may be adapted such that adapter 38 operates like a pair of pliers that are locked when retracted into the shot gun hot stick 41, but may be opened upon extension from the hot stick 41 and rotation of the hot stick 41 to rotate the plier screw mechanism to open the forks or jaws 28 and 30.

Referring to FIGS. 15A and B, another embodiment of tool 26 is illustrated with a flange positioner arm 110. Arm 110 is connected to tool 26, for example by connection to first jaw 28, although connection may be made to one or both first and second jaws 28 or 30. In the example illustrated, first jaw 28 has one or more lateral extensions 112 and 114 projecting from opposite sides of jaws 28 and 30. Arm 110 may comprise a hook 116, for fitting within a second hole 118 in the flange 18 (FIG. 15B). Thus, when tool 26 is closed with hook 116 fitted within hole 118, and tooth 36 fitted within hole 24, the flange 18 may be positively controlled and positioned. In other embodiments, arm 110 may comprise a shoulder (not shown) that abuts against a terminal edge 88 of flange 18, instead of fitting within hole 118. Hook 116 may terminate in a tooth 120 parallel with tooth 36 as shown. The flange positioner arm 110 may be removable in some embodiments. Tool 26 may have more than one connection point, such as points 111 and 113 on extensions 112 and 114, respectively, for connection with the flange positioner arm 110. Thus, arm 110 may be repositioned at different locations on tool 26 to allow for greater flexibility in positioning flange 18 in tool 26. In some cases more than one arm 110 may be connected to tool 26. Arm 110 may be pivotally connected to the tool 26 (FIG. 15A). Arm 110 may be length adjustable, for example by telescopic action or by screwing or unscrewing a hook 116 of arm 110. Features like length adjustability and pivotal connection to tool 26 allow flange 18 to be stably aligned within tool 26 across a wider range of radial positions, and allows accommodation for different spacings between holes 118 and 24. Once adjusted in length or pivoted into place, arm 110 may be locked in place by a suitable locking mechanism (not shown).

Referring to FIG. 5, a method of handling a part such as protector 10 is illustrated. Referring to FIGS. 2, 4A, 4B and 4C, the method will now be described. In a stage 100, respective ends 32 and 34 of a jaws 28, 30, respectively, are pivotally converged relative to one another to insert a tooth 36, extended at the respective end of the first jaw, within the hole 24 in the flange 18 to hold the flange 18 between the respective ends 32, 34 (sequence from FIG. 2 to FIG. 4A). In cases where tooth 36 is not used, this stage involves gripping and stabilizing the flange between respective ends 32, 34. In a stage 102, the protector 10 is positioned within an electrical power transmission system 14, for example at least partially over component 12, using a hot stick 40 connected to operate the jaws 28 and 30 (FIG. 4A). A hot stick probe 89 (FIG. 4A) may be used to assist in positioning the protector 10 at least partially over component 12. In a stage 104, the first jaw 28 and the second jaw 30 are opened relative to one another with an actuator 42 to allow the protector 10 to be released (FIG. 4B).

As discussed above, the electrical power transmission system 14 may be energized. The method may further comprise one or both of positioning and opening the tool 26 at least partially within a safe Limit of Approach 22C. Thus, positioning and opening may be carried out by a user 25 who is in a position outside the safe Limit of Approach 22C. This allows protector 10 to be remotely installed. Standard limits of approach 22 are generally set by the IEEE for live electrical systems. It should be understood that the limits of approach may vary according to region. The limits of approach 22 around energized equipment generally widens as the voltage increases. In FIG. 4A, the limits of approach 22 correspond to increasing voltages, and thus increasing radii, from limits of approach 22A-C. For this purpose, hot stick 40 may be provided in a length that is suitable for the various limits of approach standards in all jurisdictions.

Referring to FIG. 4C, in some cases the dielectric protector 10 has a flange 18' with a hole 24' corresponding to flange 18 and hole 24, respectively, and the method further comprises aligning the flanges 18 and 18' and holes 24 and 24', and applying a fastener 16, for example using a fastener applicator 20, through both holes 24 and 24' to secure the dielectric protector 10 in place. One piece fasteners such as Christmas tree fasteners may be used as shown. Fastener application may occur remotely if operated by a user (not shown) who is in a position outside the safe Limit of Approach 22C, as is shown in FIG. 4C, to allow the system 14 to remain energized.

Although the bulk of this disclosure is directed to use on parts with a flange 18 having a hole 24 in the flange 18, it should be understood that application to other types of parts is possible. For example, the embodiment of FIG. 13 may be used on a flange 18 that doesn't have a hole 24 through the flange 18. In addition, where a tooth 36 is used the hole 24 need not penetrate entirely through the flange, and in such embodiments the tooth 36 may insert fully or partially into the hole 24 to hook the flange 18 in place. Moreover, the hole 24 may be a slot communicating with terminal edge 88 of flange 18, much like the slot 48 of second jaw 30 in FIG. 7. The tooth 36 itself may be used to form the hole 24 in use. Although only one tooth 36 per tool 26 is shown, more than one tooth 36 is possible, which may assist in laterally stabilizing protector 10 within tool 26. In some embodiments, each of jaws 28 and 30 have one or more teeth 36. In further embodiments, separate teeth 36 from jaws 28 and 30 may meet or engage on closing. Although a slot 46 is used in second jaw 30 to insert tooth 36, no slot 46 may be necessary in cases where tooth 36 overbites jaw 30. The hot stick 40 may be telescopic in some cases. A range of closed and open positions are possible for jaws 28 and 30. In cases where tooth 36 is present, the jaws 28 and 30 need not grip the flange 18. In some cases the electrical power transmission system 14 is a powerline or substation system. In further embodiments the system 14 is a substation system. In some case, tool 26 may have broad application to a variety of industries.

In the claims, the word "comprising" is used in its inclusive sense and does not exclude other elements being present. The indefinite article "a" before a claim feature does not exclude more than one of the feature being present. Each one of the individual features described here may be used in one or more embodiments and is not, by virtue only of being described here, to be construed as essential to all embodiments as defined by the claims.

The embodiments of the invention in which an exclusive property or privilege is claimed are defined as follows:

1. A method of handling a dielectric protector for a component of an electrical power transmission system, the dielectric protector having a flange with a hole through the flange, the method comprising:
   pivotally converging respective ends of a first jaw and a second jaw relative to one another to insert a tooth, extended at the respective end of the first jaw, within the hole in the flange, and to grip and frictionally hold the flange in place with the respective ends;
   positioning the dielectric protector at least partially over the component within an electrical power transmission system using a hot stick connected to operate the first jaw and the second jaw, in which, while the respective ends grip the flange in place, a terminal tip and stem of the tooth point in a lateral direction relative to a central longitudinal axis of the hot stick; and
   opening the first jaw and the second jaw relative to one another with an actuator to release the dielectric protector on the component, the actuator comprising a drive rod pivotally connected to one or both of the first jaw and the second jaw, the drive rod being supported parallel to the hot stick on an external surface of the hot stick and being operable from a user end of the hot stick to open the first jaw and the second jaw;
   in which the electrical power transmission system is energized, and the dielectric protector is positioned from outside to within a safe limit of approach where the component is located, by a user who is in a position outside the safe limit of approach; and
   in which the actuator is configured to provide converging motion, between the first jaw and the second jaw, within a range of positions during use while the flange is between the respective ends, the range of positions including at least:
       a closed position where the respective ends grip and frictionally hold the flange to prevent the flange from moving relative to the respective ends while the tooth is within the hole in the flange; and
       a position where the flange is loosely held between the first jaw and the second jaw while the tooth is within the hole in the flange.

2. The method of claim 1 in which the component comprises a second flange with a second hole, and further comprising aligning the flange and hole with the second flange and the second hole, and driving a fastener through both the hole and the second hole to secure the dielectric protector in place, in which driving is done while the electrical power transmission system is energized and using a fastener applicator operated by a user who is in a position outside the safe limit of approach.

3. The method of claim 1 in which the first jaw and the second jaw are made of dielectric material.

4. The method of claim 1 in which:
   the drive rod is pivotally connected to the second jaw to pivot the second jaw on translation of the drive rod;
   the first jaw is connected to a tool end of the hot stick; and
   the second jaw is pivotally connected to the first jaw, such that during translation of the drive rod, the first jaw remains stationary relative to the hot stick and the second jaw pivots relative to the first jaw.

5. The method of claim 1 in which the first jaw and the second jaw form at least part of an adapter for the hot stick.

6. The method of claim 5 in which the first jaw and the second jaw are secured to the hot stick via corresponding universal spline attachment parts and a locking bolt.

7. The method of claim 1 in which the respective end of the second jaw defines a slot for the tooth to fit within when the tool is in a closed position.

8. The method of claim 1 in which the first jaw and the second jaw are biased into an open position.

9. The method of claim 1 further comprising a trigger connected for operation of the actuator from the hot stick.

10. The method of claim 9 in which the trigger further comprises one or more of a slide element, lever, or squeeze trigger.

11. The method of claim 10 in which the trigger is biased.

12. The method of claim 1 in which the tooth is removable.

13. The method of claim 1 in which the respective ends form flat blades whose faces define the respective ends and grip and frictionally hold the flange in place when the first jaw and the second jaw are converged to contact the flange.

\* \* \* \* \*